(12) United States Patent
Gu

(10) Patent No.: US 8,184,372 B1
(45) Date of Patent: May 22, 2012

(54) LOW NUMERICAL APERTURE (LOW-NA) SOLAR LIGHTING SYSTEM

(76) Inventor: Bingwu Gu, Elk Grove, CA (US)

( * ) Notice: Subject to any disclaimer, the term of this patent is extended or adjusted under 35 U.S.C. 154(b) by 209 days.

(21) Appl. No.: 12/584,052

(22) Filed: Aug. 27, 2009

Related U.S. Application Data

(60) Provisional application No. 61/094,113, filed on Sep. 4, 2008, provisional application No. 61/094,117, filed on Sep. 4, 2008, provisional application No. 61/094,120, filed on Sep. 4, 2008, provisional application No. 61/094,115, filed on Sep. 4, 2008.

(51) Int. Cl.
*G02B 17/00* (2006.01)
(52) U.S. Cl. ....................................................... 359/597
(58) Field of Classification Search .......... 359/591–593, 359/597; 126/569, 573; 136/246
See application file for complete search history.

(56) References Cited

U.S. PATENT DOCUMENTS

| | | | |
|---|---|---|---|
| 3,511,559 A | 5/1970 | Foster | |
| 4,297,000 A | 10/1981 | Fries | |
| 4,306,769 A | 12/1981 | Martinet | |
| 4,307,936 A | 12/1981 | Ochiai | |
| 4,349,245 A * | 9/1982 | Kliman | ............. 359/597 |
| 4,389,085 A | 6/1983 | Mori | |
| 4,411,490 A | 10/1983 | Daniel | |
| 4,425,905 A | 1/1984 | Mori | |
| 4,500,167 A | 2/1985 | Mori | |
| 4,511,755 A | 4/1985 | Mori | |
| 4,525,031 A | 6/1985 | Mori | |
| 4,539,625 A | 9/1985 | Bornstein | |
| 4,572,613 A | 2/1986 | Mori | |
| 4,700,013 A | 10/1987 | Soule | |
| 4,720,170 A * | 1/1988 | Learn, Jr. | ............. 359/597 |
| 5,022,736 A | 6/1991 | Mori | |
| 5,175,967 A | 1/1993 | Greenwood | |
| 5,371,660 A | 12/1994 | Levens | |
| 5,581,447 A | 12/1996 | Raasakka | |
| 6,057,504 A | 5/2000 | Izumi | |
| 6,128,135 A | 10/2000 | Stiles | |
| 6,178,707 B1 * | 1/2001 | Bengtson | ............. 359/597 |
| 6,299,317 B1 | 10/2001 | Gorthala | |
| 6,603,069 B1 | 8/2003 | Muhs | |
| 6,840,645 B2 | 1/2005 | Eisenman | |
| 7,190,531 B2 | 3/2007 | Dyson | |
| 7,227,077 B2 * | 6/2007 | Kleinwachter | ............. 359/591 |

(Continued)

OTHER PUBLICATIONS

Xiaohui Ning, Joseph O'Gallagher, and Roland Winston, Optics of two-stage photovoltaic concentrators with dielectric second stages, Apr. 1987, Applied Optics, vol. 26, No. 7, pp. 1207-1212.*

(Continued)

*Primary Examiner* — Christopher Mahoney
(74) *Attorney, Agent, or Firm* — Gerald R. Prettyman

(57) ABSTRACT

A low numerical aperture (low-NA) light concentration and transmission system collects, concentrates and transmits light for interior illumination. A solar tracker aligns a primary light concentrator to collect light and direct the light to a secondary light concentrator and a filter for removing ultraviolet and infrared radiation. On exiting the secondary light concentrator, the optical axis of the concentrated light is aligned to optimize the numerical aperture of the concentrated light with a numerical aperture (NA) optimizer having a light guide to direct the concentrated light to an interior luminaire. The method of the low numerical aperture transmission of light has the advantages of fewer reflections in the light guide, low loss, low cost, and easy installation and operation.

18 Claims, 15 Drawing Sheets

U.S. PATENT DOCUMENTS

| | | |
|---|---|---|
| 7,231,128 B2 | 6/2007 | Muhs |
| 7,295,372 B2 * | 11/2007 | Steneby ............... 359/592 |
| 7,339,739 B1 | 3/2008 | Kinney |
| 2006/0274439 A1 * | 12/2006 | Gordon et al. ............ 359/859 |
| 2008/0266664 A1 * | 10/2008 | Winston et al. ............ 359/592 |

OTHER PUBLICATIONS

Parans Press Release Feb. 7, 2007.*

* cited by examiner

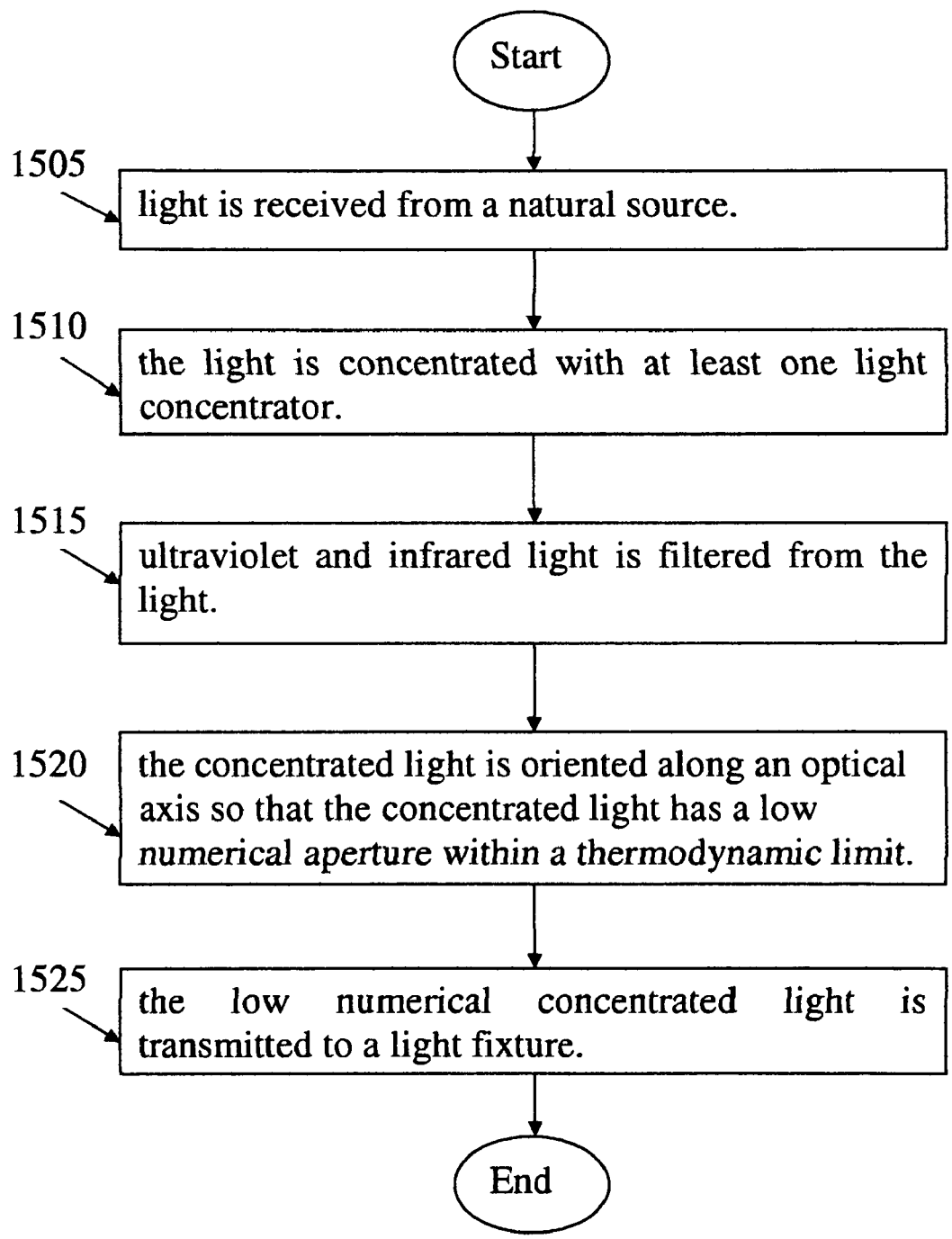

LOW NUMERICAL APERTURE (LOW-NA) SOLAR LIGHTING SYSTEM

CROSS-REFERENCE TO RELATED APPLICATIONS

This application claims the benefit of priority of U.S. Provisional Application Ser. No. 61/094,117 titled "Low Numerical Aperture (Low-NA) Solar Lighting System" filed Sep. 4, 2008, which is hereby incorporated by reference. This application also claims the benefit of priority of U.S. Provisional Application Ser. No. 61/094,113 titled "One-axis tracking concentrating photovoltaic and solar hot water hybrid system" filed Sep. 4, 2008, which is hereby incorporated by reference. This application also claims the benefit of priority of U.S. Provisional Application Ser. No. 61/094,115 titled "Alternating current electricity generation from concentrated sunlight" filed Sep. 4, 2008, which is hereby incorporated by reference. This application also claims the benefit of priority of U.S. Provisional Application Ser. No. 61/094,120 titled "Solar lighting system with one-axis tracking" filed Sep. 4, 2008, which is hereby incorporated by reference. This application is related to co-pending U.S. patent application Ser. No. 12/584,050 titled "CONCENTRATED PHOTOVOLTAIC AND SOLAR HEATING SYSTEM" filed Aug. 27, 2009, and to co-pending U.S. patent application Ser. No. 12/584,051 titled "GENERATING ALTERNATING CURRENT FROM CONCENTRATED SUNLIGHT" filed Aug. 27, 2009, both of which are incorporated by reference.

BACKGROUND

1. Field of Invention

This invention relates to the field of solar energy and lighting, and more specifically to using natural light for interior lighting.

2. Related Art

The transmission of concentrated solar energy via a light guide provides flexible options for numerous applications of solar lighting, solar heating, solar cooking, solar electric power generation, and photo physical and photochemical processes. Interior daylight lighting systems include windows and skylights, tubular solar lighting devices, and fiber optic solar lighting.

Fundamental problems remain, however, that keep solar lighting technology from widespread acceptance. Windows and skylight are limited by the shape and orientation of the building design. Solar light tubes suffer an extensive loss from collection and transmission limitations. Large diameter tubes are required because the light tube inlet is limited to collecting the solar light coming through its cross-section. Thereafter, the combined effect of multiple reflections along the length of the tube, with each reflection suffering a 5% to 15% reflection loss, diminishes the amount of light available at the outlet to less than 8% after a conservative 50 reflections in a solar light tube. Fiber optic bundles, while losing less light than solar tubes, are very expensive for general lighting applications.

SUMMARY OF THE INVENTION

Systems and methods provide for using natural light including sunlight and moonlight for optimized interior lighting. Incoming natural light is concentrated and then optimized to provide a greater luminosity than without optimization. The method of optimization aligns the concentrated sunlight to a low numerical aperture within the thermodynamic range to reduce the number of loss-inducing reflections through the light guide.

Some embodiments provide for using different concentrator systems, which may be a combination parabolic-hyperboloidal concentrator system, a combination parabolic-hyperboloidal concentrator with light guide system, a combination Fresnel lens and negative lens concentrator system, or a combination Fresnel lens and fiber optic bundle concentrator systems.

Other embodiments provide for a solar tracking system of one or multiple axis to allow for a moving light source, such as the sun or moon. Another embodiment further includes filtering the ultraviolet and infrared radiation. Some embodiments may include a horizontal or vertical light guide for redirecting the concentrated and low-NA optimized light to an interior lighting fixture.

These embodiments may be used in various configurations of a concentrator system, a tracking system, a radiation filter system, and a light guide system.

BRIEF DESCRIPTION OF THE DRAWINGS

FIG. 15 shows a flowchart of a method for concentrating natural light for interior lighting.

DETAILED DESCRIPTION OF THE INVENTION

Figure 1:
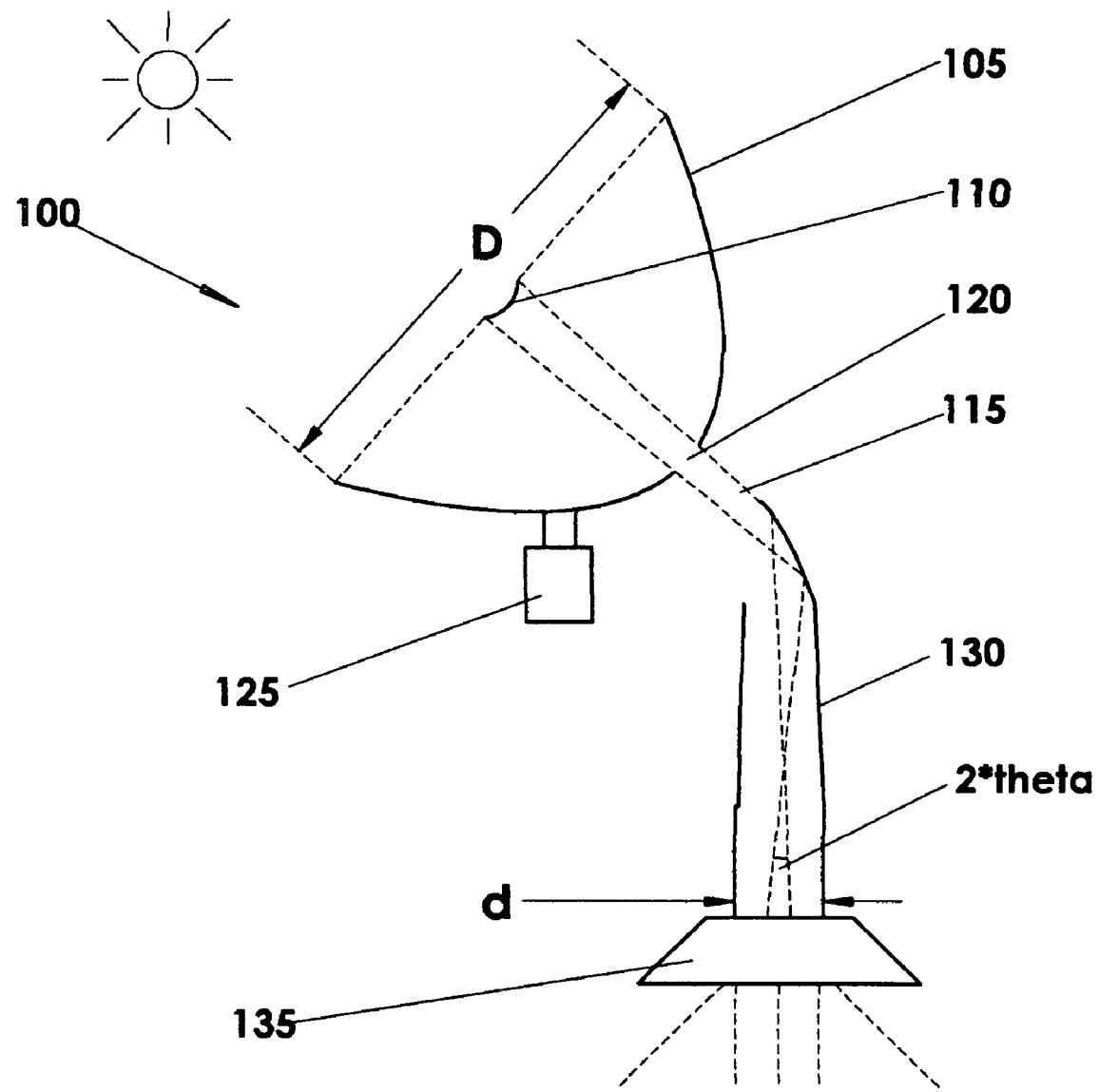
FIG. 1 shows an embodiment of the low numerical aperture lighting system.

FIG. 1 shows an embodiment of the low numerical aperture (low-NA) lighting system. The system may comprise a primary light concentrator 105, a secondary light concentrator 110, concentrated light 115, an aperture 120, a light source tracker 125, a low numerical aperture optimizer 130 and a light fixture 135.

The numerical aperture (NA) characterizes an optical system as a function of the index of refraction (n) of the medium around a collector (n=1.0 for air, n=1.33 for pure water, and up to 1.56 for oils), and the angular width (theta) of the light source with respect to the collector. Solar illuminator systems collect sunlight at one location and guide the light to a light fixture at the other end of the guide. Equation 1 algebraically characterizes the range of angles over which the system can accept or emit light.

$$NA = n * \sin(\text{theta}) \qquad \text{Equation 1}$$

Theta represents the half-angle of the maximum cone of the light source, e.g., the sun. For a non-concentrating collector focused on the sun, the maximum value of theta is 0.27. To increase the amount of captured sunlight, solar illuminators use concentrators. There is a thermodynamic limit, however, to how small the NA can be. Equation 2 describes this limit.

$$\sin(\text{theta}) > \sin(0.27) * (D/d) \qquad \text{Equation 2}$$

As shown in FIG. 1, the primary light concentrator 105 has an inside collector diameter ("D"), while the low numerical aperture optimizer 130 has an inside diameter ("d").

In actuality, natural light illuminators suffer losses between the primary collector and the illuminator fixture. The factors affecting these losses include the designed transmission efficiency (h<1), the reflectivity of the light guide (r<1, often 0.90 to 0.999) and the light guide length (L). Equation 3 describes the net natural light transmitted by a solar illuminator of this configuration.

$$\tan(\text{theta}) = <|\ln h / \ln r| * (d/L) \qquad \text{Equation 3}$$

In the present invention, incoming light enters the primary light concentrator 105. In some embodiments, the incoming light may be sunlight or reflected sunlight such as moonlight. In some embodiments, artificial light may be used. The primary light concentrator 105 concentrates the incoming light by directing the incoming light striking the primary light concentrator 105 toward a common focal point. At the common focal point is the secondary light concentrator 110, which receives the concentrated incoming light from the primary light concentrator 105. Although the secondary light concentrator 110 does not collimate the light, the secondary light concentrator 110 keeps the concentrated sunlight convergent and directs it toward aperture 120. The concentrated light 115 then exits the primary light concentrator 105 via aperture 120.

Tracking the light source is light source tracker 125, which is connected to the primary light concentrator 105 to assure that the primary light concentrator 105 is optimally oriented at all times toward the light source. In one embodiment, the light source tracker 125 monitors both the azimuth and elevation of the natural light source and with a dual axis motor system, continuously aligns the primary light concentrator 105 to directly face the natural light source. In some embodiments, the light source tracker 125 may be single axis system. Other embodiments may simply track the natural light source without aligning the primary light concentrator 105, or omit the light source tracker 125.

Figure 3:
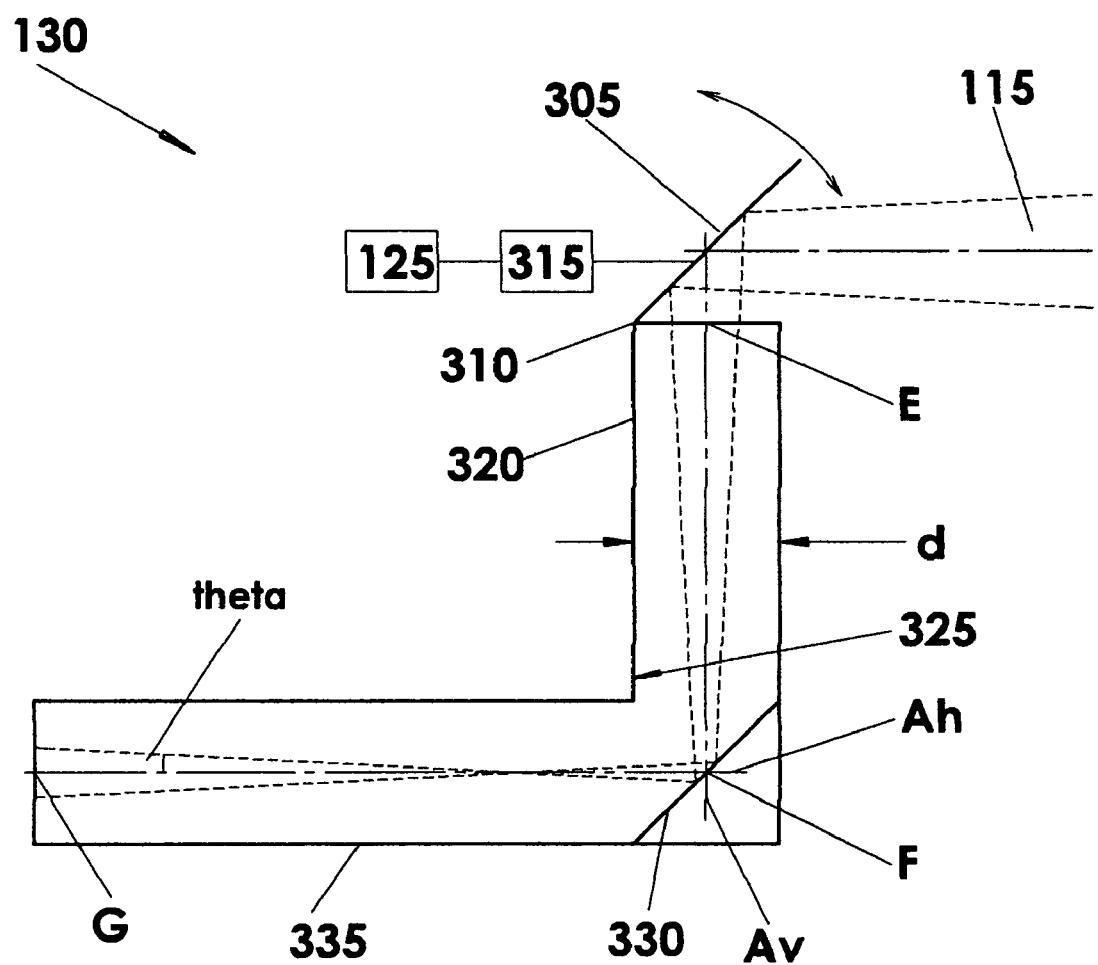
FIG. 3 shows an embodiment of the low numerical aperture (low-NA) optimizer for the low numerical aperture lighting system.

After passing through aperture 120, the concentrated light 115 enters a low numerical aperture optimizer 130 which has a diameter "d" and length "L" and which is described in greater detail in FIG. 3. In some embodiments, the low numerical aperture optimizer 130 is cylindrically shaped. The low numerical aperture optimizer may be shaped differently in other embodiments. On entering the low numerical aperture optimizer 130, the concentrated light 115 is optimized to a low-NA according to Equation 3 to provide the best lighting possible. On passing through the low numerical aperture optimizer 130, the low-NA light 115 enters the lighting fixture 135 and illuminates the adjacent area.

Figure 2:
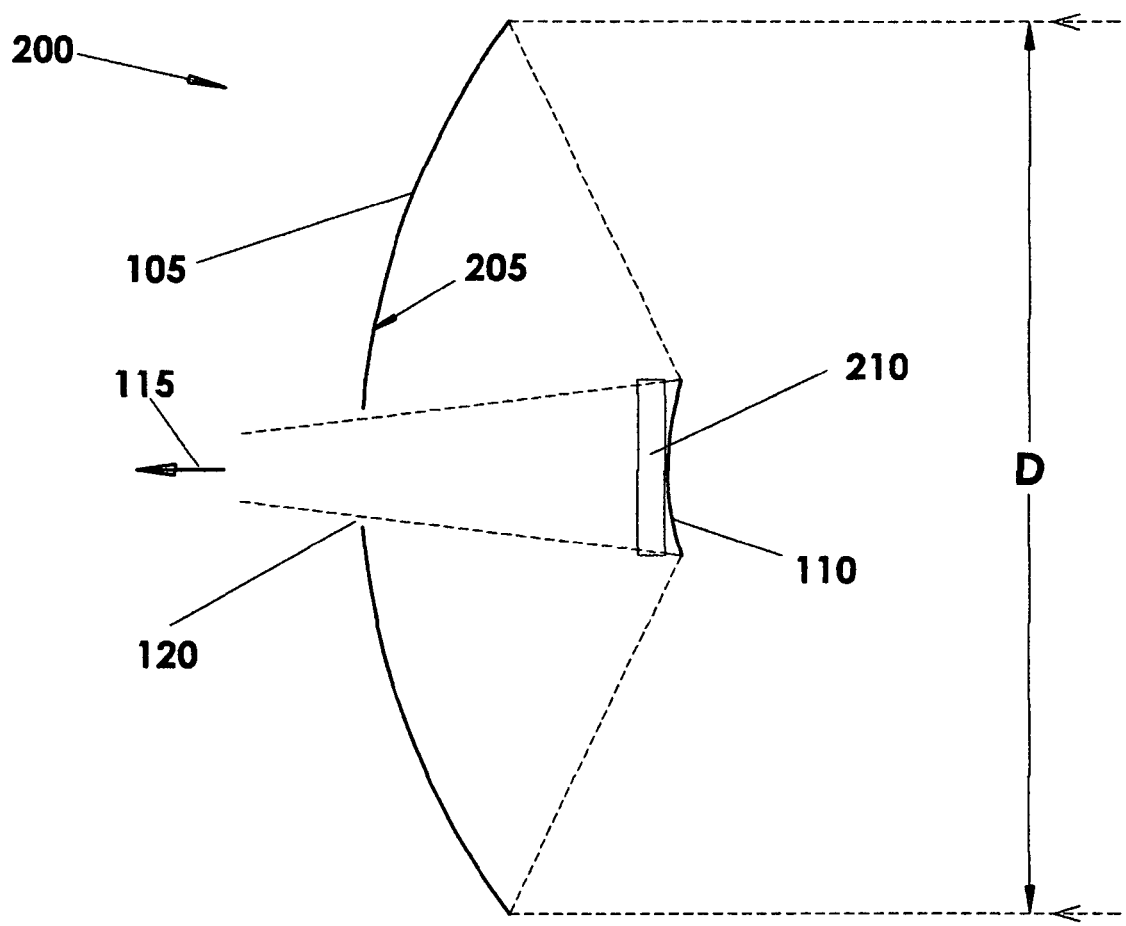
FIG. 2 shows an embodiment of the natural light collector and concentrator for the low numerical aperture (low-NA) lighting system.

FIG. 2 shows an embodiment of the natural light collector and concentrator for the low numerical aperture solar lighting system. The natural light collector and concentrator may comprise the primary light concentrator 105, the secondary light concentrator 110, the concentrated light 115, the aperture 120, a mirror film 205, and a spectrally selective filter 210.

In one embodiment, the primary light concentrator 105 may be a parabolic reflector dish. One example is a C-band parabolic satellite dish. To enhance the reflectivity of the parabolic reflector dish, the inner surface of the primary light concentrator 105 may be covered with mirror film 205. One example is a mirror film available under the brand name ReflecTech® (r approx. 0.94).

In some embodiments, the secondary light concentrator 110 may be a hyperboidally dish shaped positioned at the focal point of the primary light concentrator 105 to receive an optimum amount of the light reflected by the primary light concentrator 105.

To improve the usefulness of the concentrated light, the secondary light concentrator 110 may have a spectrally selective filter 210 to filter ultraviolet light and infrared light from the concentrated sunlight. The ultraviolet (UV) is removed from light due to its hazardous nature to human skin and furniture. The infrared (IR) is removed to reduce the heat load from sunlight, which increases the cooling cost of buildings.

Many types and brands of UV and IR filters are available. In some embodiments, a filter film such as "Energy Film®" may be applied to the primary concentrator 105. Some filter film brands may pass over 75% of the visible light while blocking 97% of the UV and 70% of the solar heat. A cold mirror coating on the secondary light concentrator 110 may suffer only 5% loss, but is likely more costly. A stand-alone hot mirror, as shown in FIG. 2 may have less or more filtering efficiency for a moderate price.

FIG. 3 shows an embodiment of the low numerical aperture optimizer 130 for the low numerical aperture lighting system. The low-NA optimizer is an assembly of optical components to achieve optimized numerical aperture of the concentrated sunlight in the light guide. The low numerical aperture optimizer 130 may comprise a highly reflective mirror 305, a reflective mirror hinge 310, a reflective mirror controller 315, an upper light guide 320, a highly reflective film 325, a light guide mirror 330 and a lower light guide 335.

On reaching the low-NA optimizer 130, the concentrated light 115 reflects off the highly reflective mirror 305. The reflective mirror hinge 310 affixes the highly reflective mirror 305 to the low-NA optimizer 130.

Controlling the angle of the highly reflective mirror 305 with respect to the low-NA optimizer 130 is the highly reflective mirror controller 315. The highly reflective mirror controller 315 acts in coordination with the light source tracker 125 to assure that the concentrated light 115 enters the low-NA optimizer 300 closer to an optimal angle.

On reflecting off the highly reflective mirror 305, the concentrated natural light 115 enters the low-NA optimizer 130 converging along the midline of upper light guide 320 as shown by line "Av."

While Equation 1 describes the numerical aperture of the light as a function of sin(theta), Equation 2 shows that the value for sin(theta) is determined as a function of the diameter of the primary light concentrator and the diameter of the low-NA optimizer 130. Consequently, the selected diameter of the upper light guide 320 of the low-NA optimizer 300 depends on the size of the primary light concentrator, and the desired efficiency of the low-NA optimizer system.

In some embodiments, the highly reflective film 325 coated inside the upper light guide 320 reflects the concentrated light 115 that is not converging along the midline of the upper light guide 320 to the light guide mirror 330. One example of a highly reflective film is available under the brand name ReflecTech® (r approx. 0.94). In some embodiments, the highly reflective film 325 may be a coating. The low-NA concentrated light 115 may then enter the lighting fixture 135 as shown in FIG. 1 and illuminate the area.

As inferred by Equation 3, the length of the solar tube detrimentally affects the luminosity of the concentrated light 115 conducted to the light fixture. The parameter L in Equation 3 equals the sum of the distance from point E at the midpoint of the entrance of the low-NA optimizer 130, to point F on the surface of the light guide mirror 330 to point G at the end of the lower light guide 335. Consequently, longer solar tubes without the low-NA optimizer suffer larger luminosity losses.

A shortened light guide directly above the light fixture 135 as shown in FIG. 1 may not be possible. To provide for low-NA optimized lighting in those instances, some embodiments of the present invention may comprise the light guide mirror 330 and the lower light guide 335.

On exiting the upper light guide 320, the concentrated light 115 enters the lower light guide 335 and strikes the light guide mirror 330. As the angle of incidence is equal to the line of reflection, the concentrated light 115 reflects into the lower light guide 335 with the same angle along horizontal optical axis Ah thus optimizing the concentrated light 115 to a low-NA.

The lower light guide 335 may be fabricated from 0.020" PVD coated aluminum sheet. It is of 99.9% specular reflectivity at 60° angle (emissivity=0.03, –ASTM E 1651-94, 179-81 & 430-78). The highly reflective aluminum sheet may be rolled into a 3" diameter light tube. As with the upper light guide 320, the lower light guide 335 may also be coated with the highly reflective film 325. As inferred by Equations 2 and 3, the r-value of the highly reflective film and the light guide diameter (d) of the low-NA optimizer 130 affect the range of numerical aperture of the concentrated light. Consequently, consistency in the r-value of the highly reflective film 325 and in the diameter of the light guides 320 and 335 throughout the low-NA optimizer 130 affect the luminosity of the light from the lighting fixture 135. Thus, the same highly reflective film and the same light guide diameter are preferentially used in each light guide portion 320 and 335 on either side of the light guide mirror 330.

Another advantage of the present invention is that with either the sun high above, or low in the sky, the low-NA optimizer system delivers a low-NA concentrated light with minimized reflective losses to the light fixture 135 (not shown). Consequently, the low-NA optimizer system negates the need for large diameter solar tubes prevalent in typical solar installations.

Figure 4:
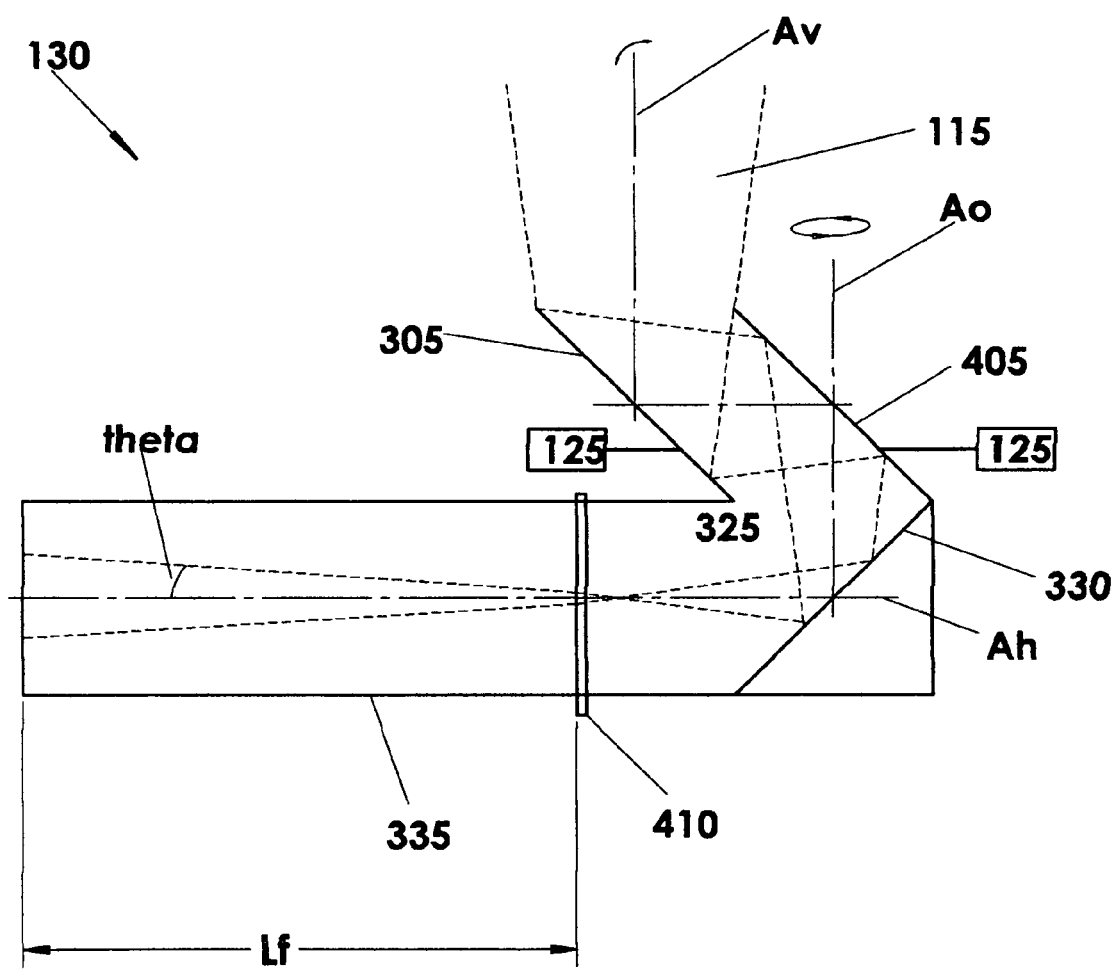
FIG. 4 shows an alternate embodiment of the low numerical aperture (low-NA) optimizer for the low numerical aperture lighting system.

FIG. 4 shows an alternate embodiment 400 of the low numerical aperture optimizer 130 for the low numerical aperture lighting system 100. The low numerical aperture optimizer may further comprise a second highly reflective mirror 325, and a diverging refractive lens 410 (a.k.a. a negative lens). This embodiment may comprise the primary and secondary light concentrator (not shown here) as shown in FIG. 1 and FIG. 2.

In some installations, the configuration of the light source, the building and the primary light concentrator may be such that the low-NA optimizer 130 is not above the lighting fixture 135. In some of these embodiments, the alternate embodiment 400 of the low numerical aperture optimizer may be suitable.

As shown in FIG. 4, the concentrated light 115 enters the low-NA optimizer 400 along an optical axis "Av." To achieve an optimal low-NA concentrated light, there may be one or more of the highly reflective mirrors 305 and 325 to direct the concentrated light 115 into the light guide 335.

As the angle of incidence is equal to the angle of reflection, the light guide mirror 330 reflects the concentrated light 115 along a line approximating the optical axis Ah.

On exiting the light guide mirror 330, the concentrated light 115 enters the light guide 335 portion of the low-NA optimizer 400. The light guide 335 conducts the concentrated light 115 towards the light fixture.

In typical solar tube installations, the diameter of the light guide is approximately equal to diameter of the primary light concentrator to maximize luminosity at the fixture. In the present invention, however, a diverging refractive lens 410 having a focal length Lf may be positioned in lower light guide 335 to optimize the low-NA concentrated light and minimize luminosity losses from reflections. This benefit of the present invention mitigates the losses of long light guides and the need for large diameter tubing. In particularly long light guides, more than one diverging refractive lens 410 may be used and properly spaced apart according to the focal length of the lens.

Some incoming light may be at such a low angle that it diverges from the optical axis Ah before reaching the diverging refractive lens 410. To minimize these losses, the lower light guide 335 may also have a highly reflective film 325 or coating as earlier described.

Figure 5:
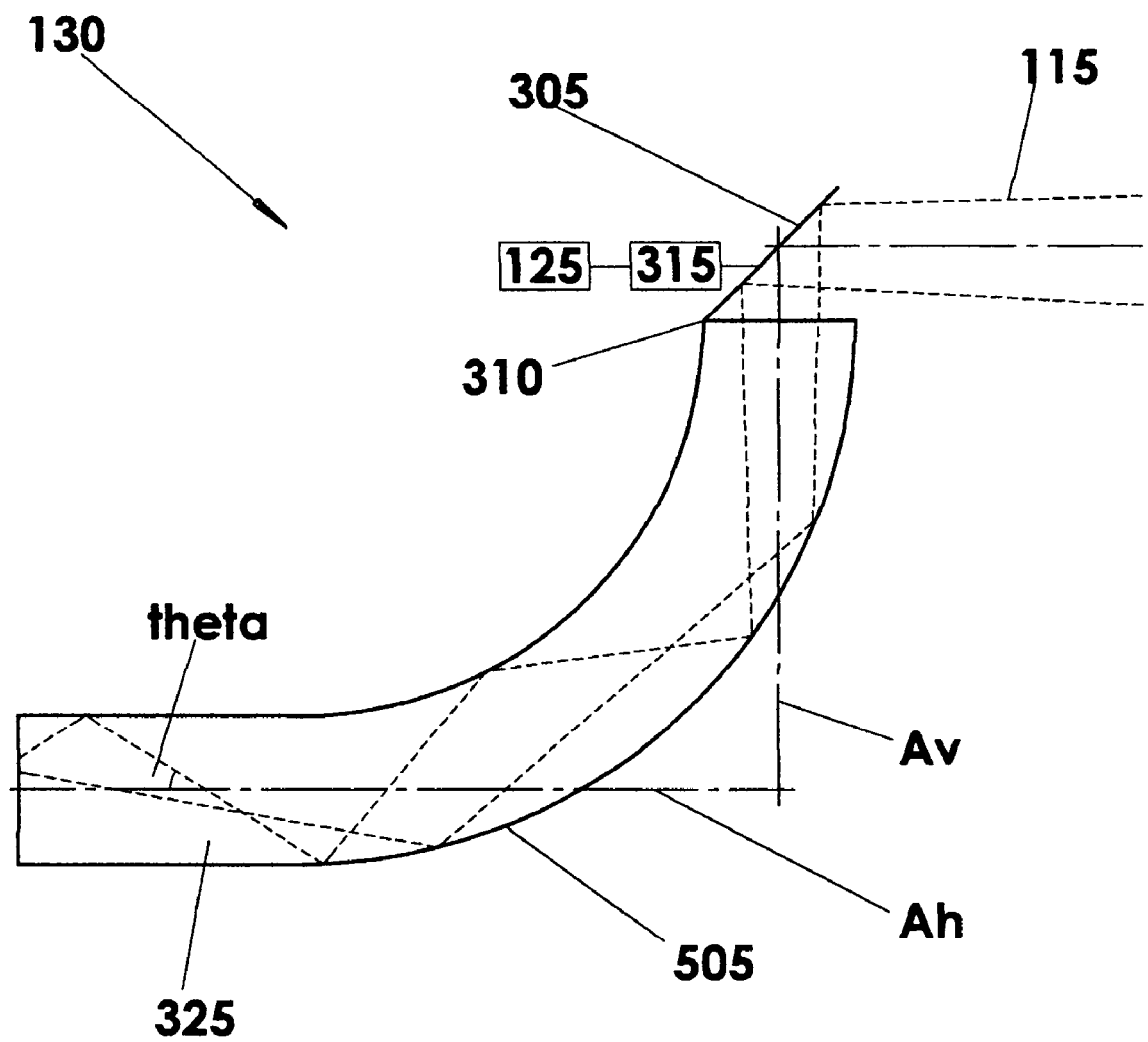
FIG. 5 shows a different embodiment of the low numerical aperture (low-NA) optimizer for the low numerical aperture (low-NA) lighting system.

FIG. 5 shows a different embodiment 500 of the low numerical aperture optimizer 130 for the low numerical aperture lighting system 100. This embodiment may comprise the highly reflective mirror 305, the highly reflective mirror hinge 310, the highly reflective mirror controller 315, the solar tracker 125, a semi-circular light guide 505, and the highly reflective film 325 (not shown). This embodiment may comprise the primary and secondary light concentrator (not shown here) as shown in FIG. 1 and FIG. 2.

In lieu of the light guide mirror 330, the low-NA optimizer 500 has an inside coating of the highly reflective film 325 to optimize the concentrated light 115 to a low-NA. Once again, the optical axis lines Av and Ah are perpendicular to each other, with the semi-circular light guide 505 shaped to optimize the low numerical aperture of the concentrated light within the thermodynamic limit.

Figure 6:
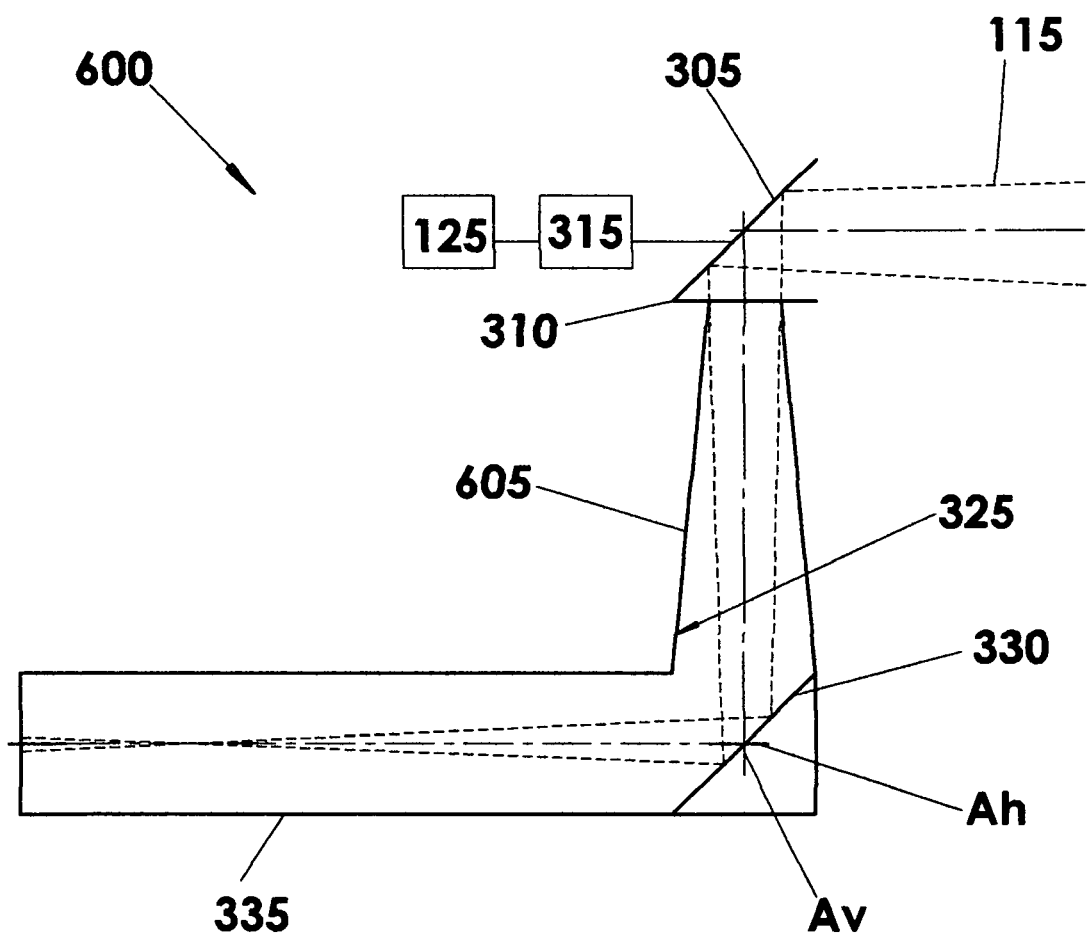
FIG. 6 shows another embodiment of the low numerical aperture (low-NA) optimizer for the low numerical (low-NA) aperture lighting system.

FIG. 6 shows another embodiment 600 of the low numerical aperture optimizer 130 for the low numerical aperture lighting system 100. The low numerical aperture optimizer 600 may comprise the primary and secondary light concentrator (not shown here) as shown in FIG. 1 and FIG. 2. This embodiment may comprise the highly reflective mirror 305, connected to the highly reflective mirror controller 315, which works in coordination with solar tracker 125 to align highly reflective mirror 305 so that concentrated light 115 enters the upper light guide 605 properly aligned to optical axis Av. The embodiment 600 may also comprise the light guide mirror 330 and lower light guide 335, although these are optional as described in FIG. 3.

This embodiment of the low-NA optimizer 600 differs from other embodiments in that the upper light guide 605 may be in the shape of a reverse compound parabolic concentrator (CPC) or other shape of a reverse conic concentrator. The upper light guide 605 in the shape of a compound parabolic concentrator offers the advantage of orienting the incoming light to a lower numerical aperture. As with the upper light guide 320, the upper light guide 605 may be coated on the interior with the highly reflective film 325.

Consequently, the embodiment of the low-NA optimizer 600 delivers relatively the same amount of light to the light fixture 135 (not shown) at the end of the lower light guide 335 as other embodiments of the low-NA optimizer. Some embodiments of the low-NA optimizer 600 may include the diverging refractive lens 410.

Figure 7:
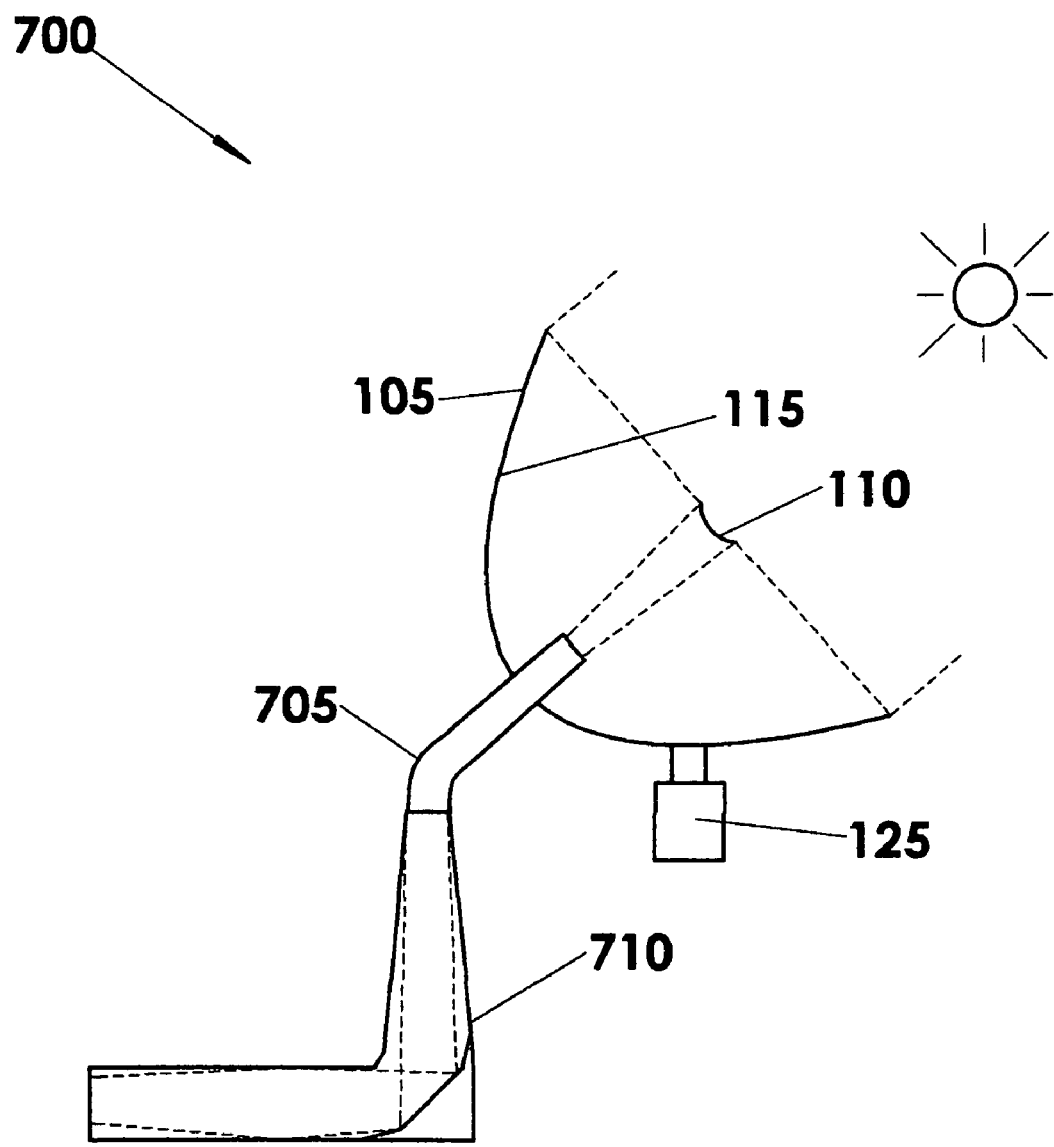
FIG. 7 shows an alternate embodiment of the low-NA lighting system.

FIG. 7 shows an alternate embodiment 700 of the low-NA lighting system. The system 700 may comprise the primary light concentrator 105, the secondary light concentrator 110, the concentrated light 115, the solar tracker 125, a transitional light guide 705, the light source tracker 125, the CPC low numerical aperture optimizer 710, and the light fixture 135 (not shown). The UV and IR filter 210 as shown and described in FIG. 2 is optional, and is not shown here. The embodiment 700 may also comprise the light guide mirror 330 and lower light guide 335, although these are also optional as described in FIG. 3.

On reaching the low-NA lighting system 700, light enters the primary light concentrator 105 and secondary light concentrator 110. A transitional light guide 705 conducts the concentrated light 115 to the CPC low-NA optimizer 710 with little loss. Consequently, the CPC low-NA optimizer 710 receives approximately as much light as in other embodiments. In some embodiments, the transitional light guide 705 may be a fiber optic bundle. In some embodiments, the transitional light guide 705 may be a light guide as described for lower light guide 335.

The low-NA optimizer 710 is similar to the previously described low-NA optimizers, but lacks the highly reflective mirror 305 and the highly reflective mirror controller 310. Some embodiments of the low-NA optimizer 710 may include the diverging refractive lens 410. Some embodiments of the low-NA optimizer system 700 may use a different low-NA optimizer such as embodiments 130, 400 or 500, but without the highly reflective mirror 305 and the highly reflective mirror controller 310.

Figure 8:
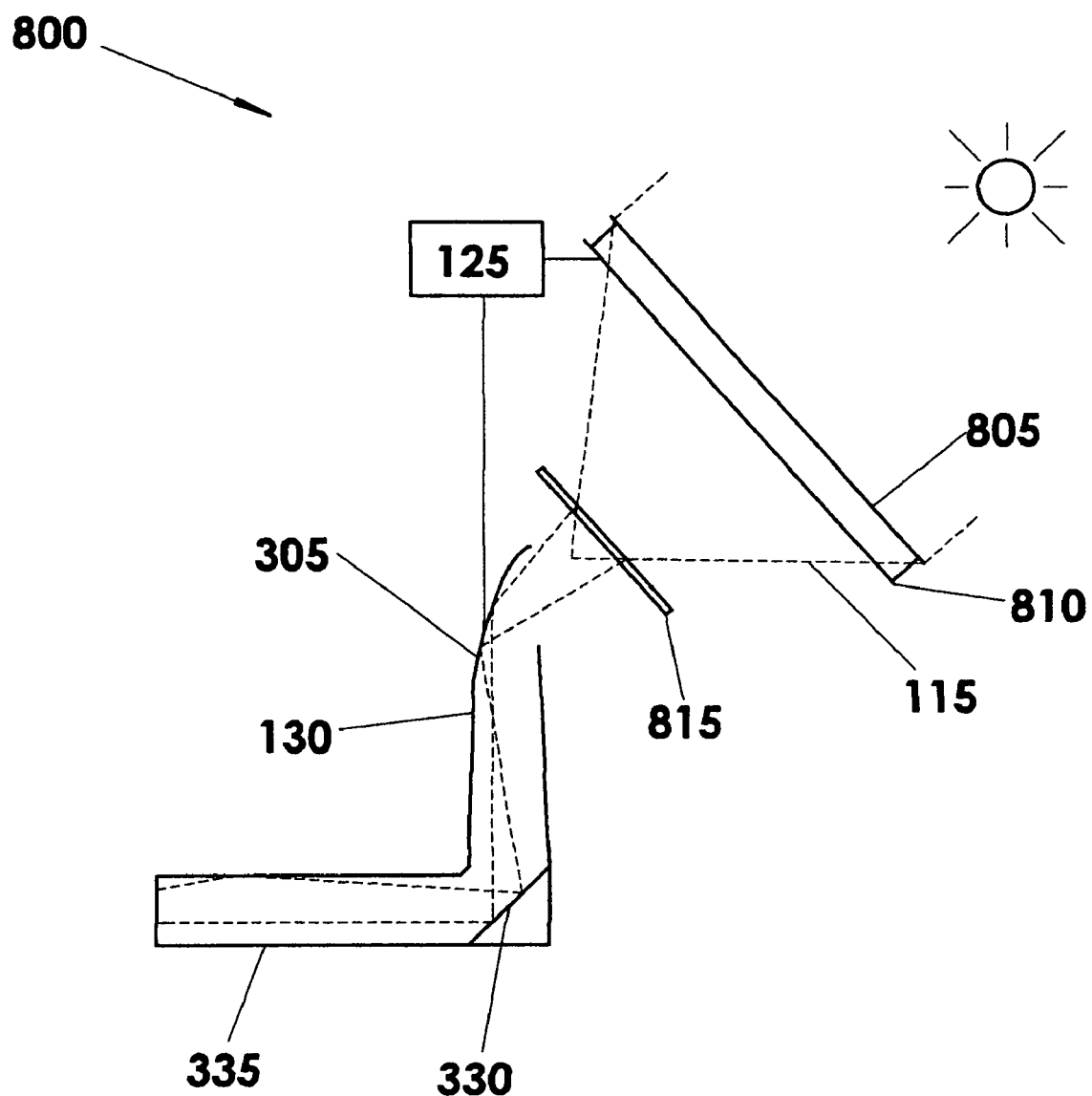
FIG. 8 shows a different embodiment of the low-NA lighting system.

FIG. 8 shows a different embodiment 800 of the low-NA lighting system. The low-NA lighting system may comprise the solar tracker 125, a Fresnel lens 805, a UV and IR filter 810, the concentrated light 115, with the low-NA optimizer 130 of FIG. 3, comprising the highly reflective mirror 305, the light guide mirror 330, the lower light guide 335 and the highly reflective film 325 coating the light guides 320 and 335. Some embodiments may comprise a diverging refractive (negative) lens 815.

On reaching the low-NA lighting system 800, light enters the Fresnel lens 805, which may be used in place of the primary light concentrator 105 and the secondary light concentrator 110. The solar tracker 125 controls the position of the Fresnel lens 805. The Fresnel lens 805 includes a substantially polygonal focusing portion adapted to focus the incoming light to the NA optimizer 130. On either side of the Fresnel lens 805, a UV and IR filter 810 may be placed to filter the UV and IR radiation as described in FIG. 2. More than one Fresnel lens may be used, but they should all share the same focus point to assure the best low-NA optimization.

In some embodiments, as shown here, the diverging refractive (negative) lens 815 may be used between the Fresnel lens and the NA optimizer 130 to modify the numerical aperture of the concentrated light before reaching the NA optimizer 130.

The shapes and functions of the low-NA optimizer 130, comprising the upper light guide 320, the light guide mirror 330, and the lower light guide 335 are as earlier described. Some embodiments may include the diverging refractive lens 410.

Figure 9:
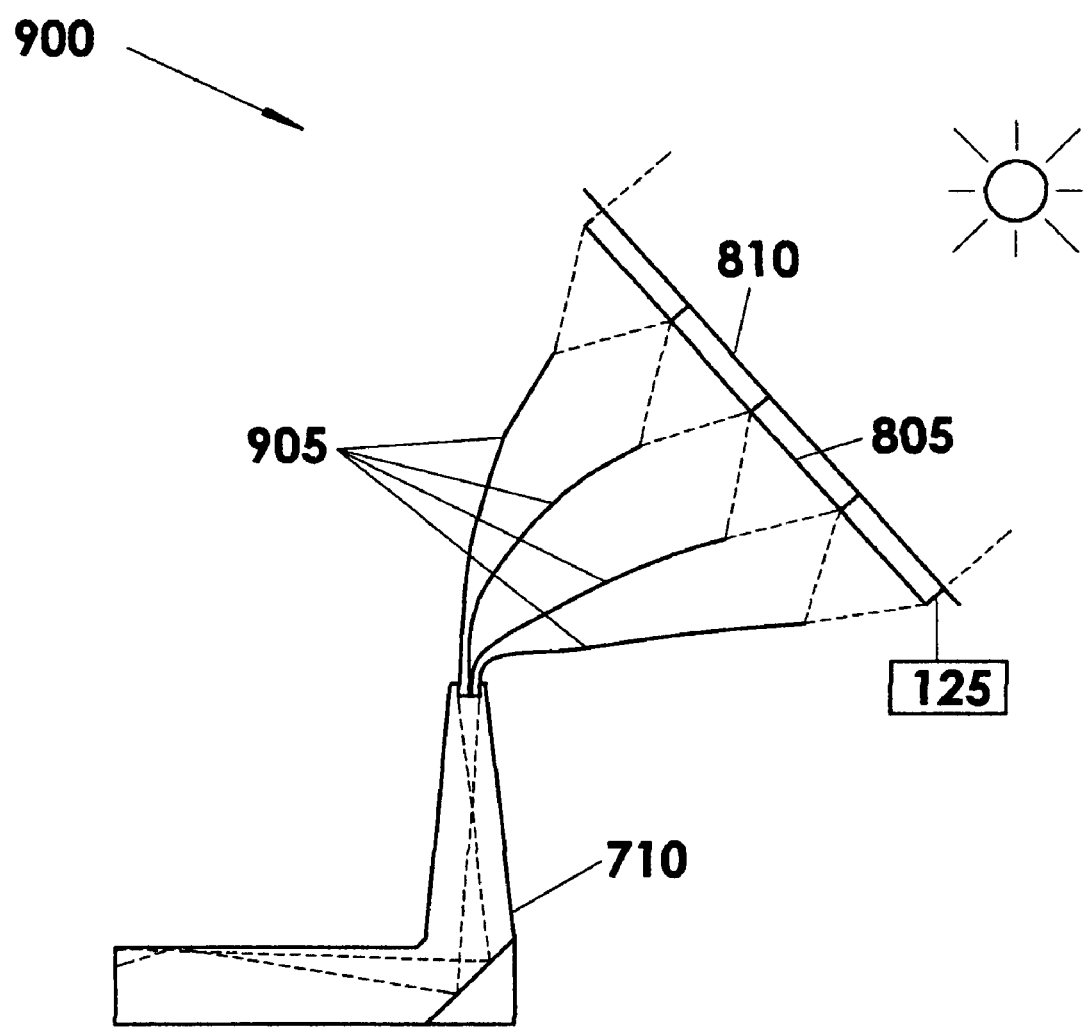
FIG. 9 shows another embodiment of the low-NA lighting system.

FIG. 9 shows another embodiment 900 of the low-NA optimizer system. The system may comprise the solar tracker 125 controlling a plurality of Fresnel lens 805, at least one UV and IR filter 810, a plurality of fiber optic bundles 905, and the low-NA optimizer 710. In this embodiment, the plurality of Fresnel lens 805 may not have the same focus point. Instead, the plurality of fiber optic bundles 905 transmit the concentrated light 115 from the plurality of Fresnel lens to the low-NA optimizer 710.

The plurality of fiber optic bundles 905 should have a large numerical aperture. Sizes of 3-mm with 30-degree accepting angle and 5-mm optical fiber with 40-degree accepting angle have been successfully tested. Acrylic 3-mm diameter rods have also been successfully used as the plurality of fiber optic bundles 905.

The function and elements comprising the low-NA optimizer 710 are described in FIG. 7. Some embodiments may include the diverging refractive lens 410. Some embodiments of the low-NA optimizer system 900 may use a different low-NA optimizer such as embodiments 130, 400 or 500.

Figure 10:
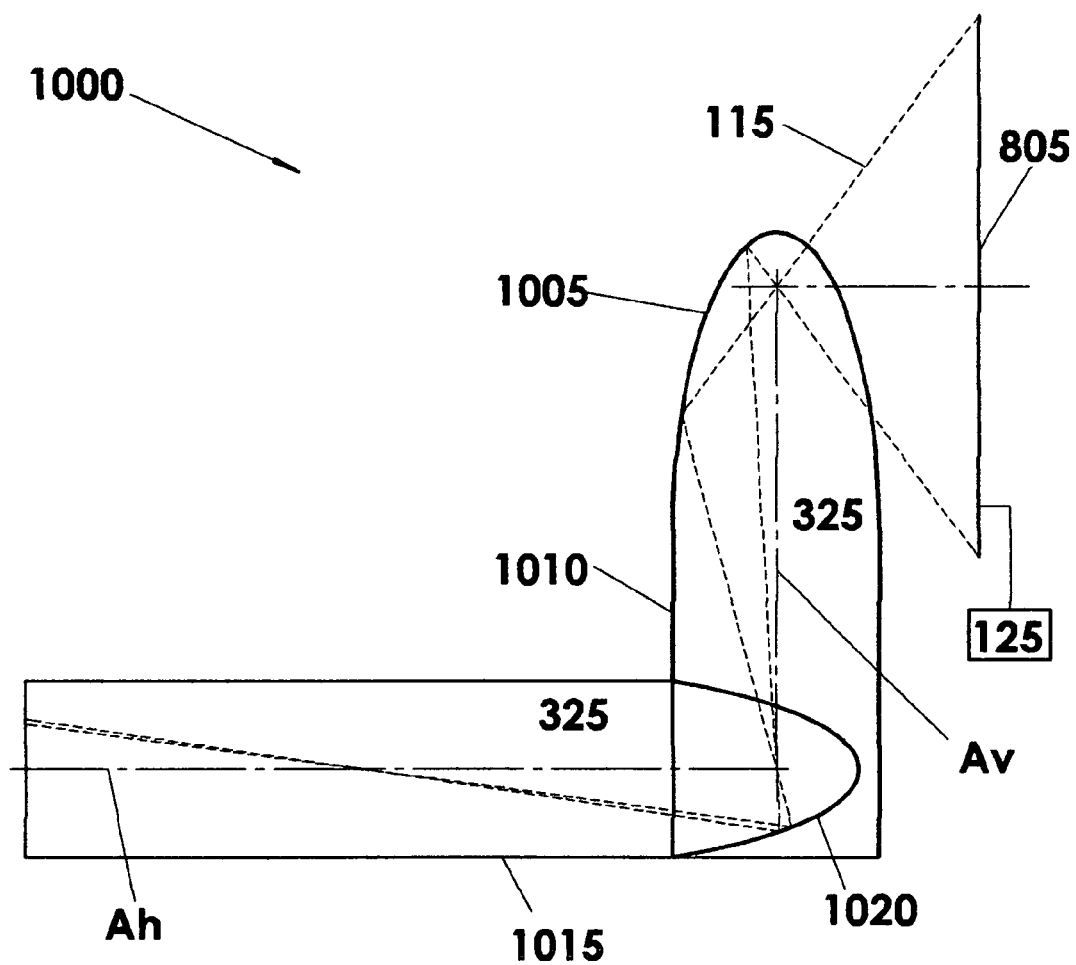
FIG. 10 shows a different embodiment of the low-NA lighting system.

FIG. 10 shows a different embodiment 1000 of the low-NA lighting system. The low-NA lighting system 1000 may comprise the Fresnel lens 805, the concentrated light 115, a low-NA optimizer comprising a concentrated light collecting reflector 1005 with highly reflective film 325, an upper light guide 1010 with highly reflective film 325, a lower light guide 1015 with highly reflective film 325, and a reflector 1020. Other elements of the system, such as the solar tracker 125, the optional UV and IR filter 810 and the negative lens 815 may be present in the invention, but are not shown here for simplicity.

On reaching the low-NA lighting system, light enters the solar tracker 125 controlled the Fresnel lens 805, which may be used in place of the primary light concentrator 105 and the secondary light concentrator 110. The Fresnel lens 805 includes a substantially polygonal focusing portion adapted to focus the incoming light to the reflector 1005. On either side of the Fresnel lens 805, the UV and IR filter 810 (not shown) may be placed to filter the UV and IR radiation as described in FIG. 2. More than one Fresnel lens may be used, but they should all share the same focus point to assure the best low-NA optimization.

The concentrated light 115 enters the concentrated light-collecting reflector 1005 of the low-NA lighting system 1000, which may be with highly reflective film 325. In some embodiments, the concentrated light-collecting reflector 1005 may have an open port for receiving the concentrated light 115. In some embodiments, the concentrated light-collecting cone 1005 may be completely transparent for receiving the concentrated light 115. Other embodiments of the concentrated light-collecting reflector 1005 may receive the concentrated light 115 through a transparent or internally mirrored window.

The highly reflective film 325 of the concentrated light-collecting reflector 1005 reflects the concentrated light 115 into the upper light guide 1010. The upper light guide 1010 transmits the incoming light to a low-NA along optical axis Av, and then into the lower light guide 1015 with its reflector 1020. As with the other embodiments of the low-NA optimizer, the upper light guide 1010 and the lower light guide 1015 are coated with the highly reflective film 325.

The length, angle and diameter of the reflector 1020 are constructed to orient the concentrated light 115 to a low-NA along the optical Axis Ah, and then towards the light fixture 135 (not shown). Some embodiments of the low-NA lighting system 1000 may include the diverging refractive lens 410.

Embodiments of the concentrated light collecting reflector 1005 or the reflector 1020 of the low-NA lighting system 1000 may comprise a conic exponential concentrator, a reverse conic parabolic concentrator, a reverse conic exponential concentrator, a parabolic reflector or an elliptical reflector.

Figure 11:
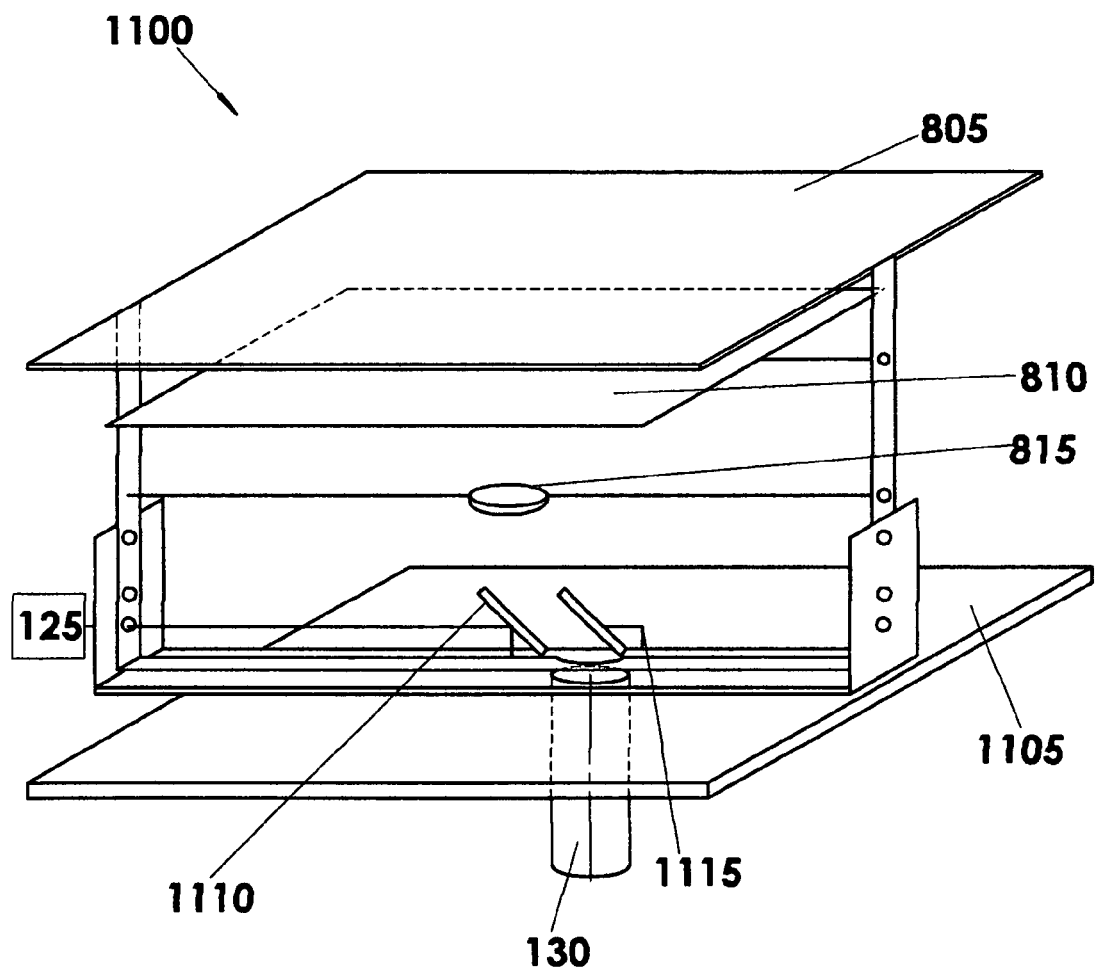
FIG. 11 shows an embodiment of the low-NA lighting system.

FIG. 11 shows an alternative embodiment 1100 of the low-NA lighting system. The system 1100 comprises the Fresnel lens 805, the optional UV and IR filter 810, the negative lens 815, a support base 1105, the solar tracker 125, an elevation-adjusted highly reflective mirror 1110, an azimuth-adjusted highly reflective mirror 1115, and the low-NA optimizer 130.

On reaching the low-NA lighting system 1100, light enters the Fresnel lens 805, which may be used in place of the primary light concentrator 105 and the secondary light concentrator 110. On either side of the Fresnel lens 805, a UV and IR filter 810 may be placed to filter the UV and IR radiation as described in FIG. 2. More than one Fresnel lens may be used, but they should all share the same focus point to assure the best low-NA optimization.

The negative lens 815 is near the focal point of the Fresnel lens to modify the numerical aperture of the concentrated light 115 as shown in FIG. 8 before reaching the low-NA optimizer 130.

Above and on either side of the entrance to the low-NA optimizer are the at least two highly reflective mirrors, 1110 and 1115. The solar tracker 125 adjusts the elevation and azimuth of the highly reflective 1110 and 1115 respectively to compensate for the movement of the sun. Highly reflective mirror 1110 is aligned to the optical axis of the Fresnel lens 805. Highly reflective mirror 1115 is aligned to the optical axis of the low-NA optimizer 130. With this continuous adjustment, the elevation and azimuth adjusted highly reflective mirrors 1110 and 1115 reflect the incoming light into the low-NA optimizer 130 with little loss.

Any of the described embodiments of the low-NA optimizers 130, 300, 400, 500, or 600 may be used for enjoyment of the low-NA optimized light from the low-NA lighting system 1100. Some embodiments of the low-NA lighting systems may include the diverging refractive lens 410. The transmitted light from any of the low-NA lighting systems may also be used for heating, cooking, and other applications.

Figure 12:
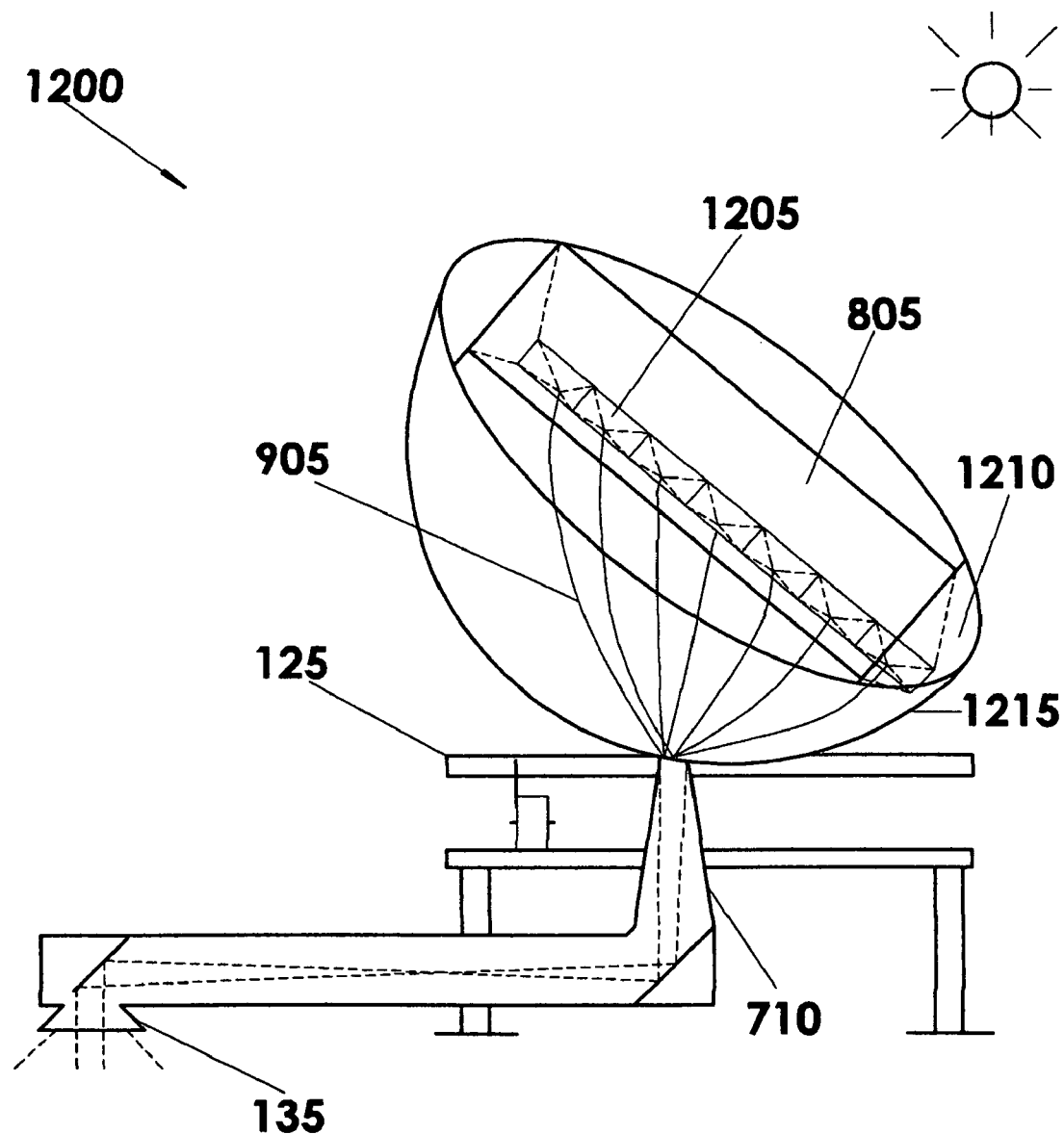
FIG. 12 shows an embodiment of the one-axis low-NA lighting system

FIG. 12 shows an embodiment 1200 of the one-axis low-NA lighting system. The one-axis low-NA lighting system 1200 comprises the solar tracker 125, a primary concentrator 805, a secondary concentrator 1205, at least one fiber optic bundle 905, the low-NA-optimizer 710, and the light fixture 135. Some embodiments may comprise an inlet window 1210 and an enclosure 1215.

The primary concentrator 805 may be a Fresnel lens described in FIG. 8. Protecting the primary concentrator 805 may be an inlet cover 1210. The inlet window 1210 may be constructed of a framed glass or acrylic window. Both glass and acrylic windows have good light transmission while providing adequate protection for the system. The UV and IR filter (FIG. 2, 210) "Energy Film" may be attached to the inner surface of the window.

The enclosure 1215 provides support to the primary concentrator 805 and the secondary concentrator 1205 and protects these optical components from dust, water, wind, and UV radiation. The primary concentrator may be affixed to the enclosure 1215, which may be fixed to the solar tracker 125. The solar tracker 125 operates in the azimuth-tracking mode in this embodiment. The elevation angle may be adjustable by changing the screw location. For year round operation, the primary concentrator should be tilted by the local solar zenith angle of equinox.

The secondary concentrator 1205 further concentrates the concentrated light 115 and conducts the concentrated light 115 from the primary concentrator to the at least one fiber optic bundle 905. The secondary concentrator 1205 may be a compound parabolic concentrator (CPC). The secondary concentrator 1205 may be formed of acrylic, which has a refraction index of about 1.46. The acrylic CPC in air is designed to be a total internal reflection (TIR) CPC. The collecting angle (q sub in) of the secondary concentrator should be greater than 23.5 degree or the maximum exit angle of the primary concentrator. This is due to the angle of incidence onto the normal of the CPC, which varies between 23.5 degree at the summer solstice and −23.5 degree at the winter solstice. The exit angle (q sub out) of the secondary concentrator is designed to match the numerical aperture of the optical fibers. All surfaces of the acrylic CPC, especially both end surfaces, need to be polished. The exit cross section of the CPC should not be bigger than that of the optical fiber. The CPC with the optical fiber can be made into one piece by the injection mold technique. An anti-reflection (AR) coating or AR film may be applied to the entering end surface of the CPC to reduce the reflection loss. Glass, quartz, or other transparent materials may be used in the place of acrylic.

The at least one fiber optic bundle 905 transmits the concentrated light to the low-NA optimizer 710. The at least one fiber optic bundle 905 are described in FIG. 9. An advantage of an acrylic fiber optic bundle 905 is that it may be combined with the secondary concentrator 1205 into one component.

The function and elements comprising the low-NA optimizer 710 are described in FIG. 7. The low-NA optimized light is then conducted to the light fixture 135 for illumination.

Figure 13:
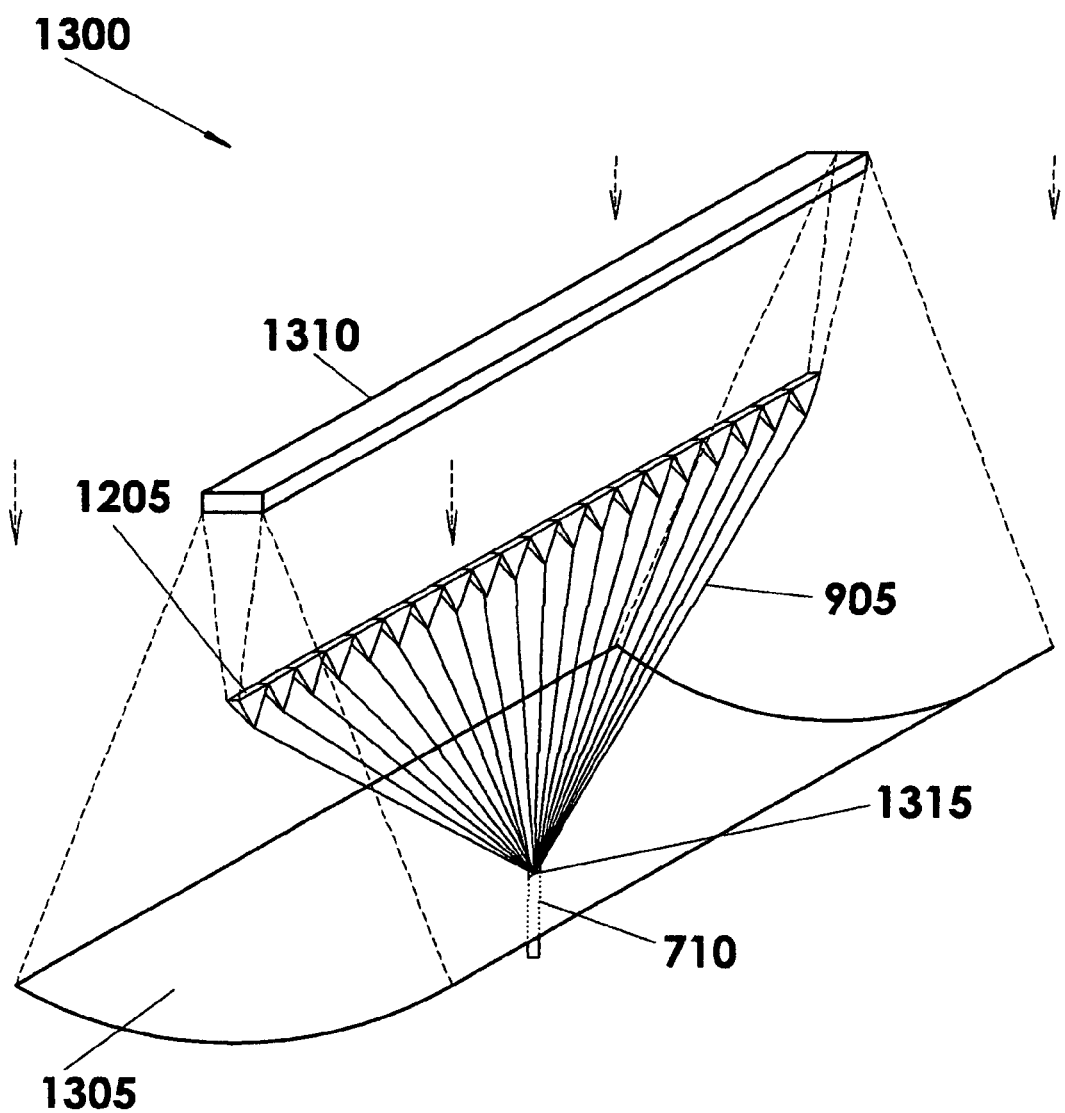
FIG. 13 shows an alternative embodiment of the one-axis low-NA lighting system.

FIG. 13 shows an alternative embodiment 1300 of the one-axis low-NA lighting system. The one-axis low-NA lighting system 1300 comprises the solar tracker 125, a primary concentrator 1305, a highly reflective linear mirror 1310, a secondary concentrator 1205, at least one fiber optic bundle 905, an aperture 1315, the low-NA optimizer 710, and the light fixture 135 (not shown).

The primary concentrator 1305 concentrates incoming light as a thin line of concentrated light 115 to the mirror 1310. The primary concentrator 1305 may be a parabolic trough 1305. The primary concentrator may be affixed to the solar tracker 125. The solar tracker 125 operates in the azimuth-tracking mode in this embodiment. The elevation angle may be adjustable by changing the screw location. For year round operation, the primary concentrator should be tilted by the local solar zenith angle of equinox.

The highly reflective linear mirror 1310 reflects the concentrated light 115 to the secondary concentrator 1205. The highly reflective linear mirror 1310 may be a flat mirror, a concave reflector, or a convex reflector. The highly reflective linear mirror 1310 should be narrow since its shadow will block some of the incoming light and cause a shadowing loss of incoming light.

The secondary concentrator 1205 may be a compound parabolic concentrator as described in FIG. 12 to conduct the concentrated light 115 to the at least one fiber optic bundle 905. The at least one fiber optic bundle 905 is described in FIG. 9 for conducting the concentrated light 115 to the low-NA optimizer 710.

An aperture 1315 through the primary concentrator 1305 may be used with the at least one fiber optical bundle 905 to transport the concentrated light 115 to the low-NA optimizer 710. The function and elements comprising the low-NA optimizer 710 are described in FIG. 7. The low-NA optimized light is then conducted to the light fixture 135 for illumination (not shown).

Figure 14A:
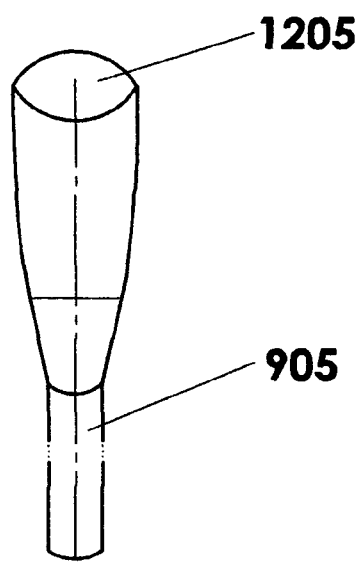
FIG. 14 shows expanded views of a compound parabolic secondary concentrator.
Figure 14B:
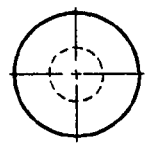
Figure 14C:
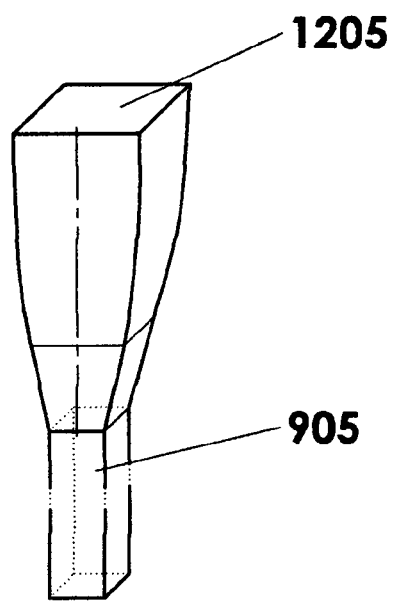
Figure 14D:
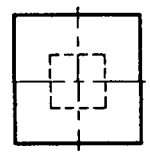

FIGS. 14A, 14B, 14C and 14D show an expanded view of a compound parabolic secondary concentrator. In some embodiments, the secondary concentrator may be a circular conical concentrator (FIGS. 14A and 14B). In some embodiments, the secondary concentrator may be a non-circular conical concentrator. The secondary concentrator may be a square conical concentrator (FIGS. 14C and 14D).

FIG. 15 shows a flowchart of a method for concentrating natural light for interior lighting.

At step 1505, light is received from a natural source.

At step 1510, the light is concentrated with at least two light concentrators.

At step 1515, ultraviolet and infrared light is filtered from the light.

At step 1520, the concentrated light is oriented along an optical axis so that the concentrated light has a low numerical aperture within a thermodynamic limit.

At step 1525, the low numerical concentrated light is transmitted to a light fixture.

The embodiments discussed here are illustrative of the present invention. Elements in the figures are illustrated for simplicity and clarity and are not drawn to scale. Some elements may be exaggerated to improve the understanding of various embodiments. The descriptions and illustrations, as well as the various modifications or adaptations of the methods and/or specific structures described are within the spirit and scope of the present invention. Hence, these descriptions and drawings should not be considered in a limiting sense, as it is understood that the present invention is in no way limited to only the embodiments illustrated.

What is claimed is:

1. A low numerical aperture system for transmitting light for interior lighting, comprising:
   a light tracking system for aligning at least one light concentrator towards a light source;
   at least one light concentrator for receiving light from the light source, concentrating the light and directing the concentrated light towards at least one highly reflective mirror;
   at least one highly reflective mirror movably affixed to a low-NA optimizer and configured to coordinate to a solar tracking axis by the light tracking system to reflect the concentrated light into the low-NA optimizer; and
   a low-NA optimizer comprising at least one light guide having at least one optical axis and at least one light guide mirror such that the low-NA optimizer is configured to orient the concentrated light along the optical axis and to optimize the numerical aperture of the concentrated light within a thermodynamic limit and to transmit the low-NA optimized concentrated light for interior lighting.

2. The low numerical aperture system for transmitting light for interior lighting of claim 1 wherein the light tracking system comprises at least a one-axis solar tracking system.

3. The low numerical aperture system for transmitting light for interior lighting of claim 1 wherein the at least one light concentrator comprises a parabolic reflector and a hyperboloidal reflector.

4. The low numerical aperture system for transmitting light for interior lighting of claim 1 further comprising at least one filter for filtering ultraviolet and infrared radiation from the light.

5. The low numerical aperture system for transmitting light for interior lighting of claim 1 wherein the low-NA optimizer further comprises a highly reflective film for orienting concentrated light to a low numerical aperture.

6. The low numerical aperture system for transmitting light for interior lighting of claim 1 wherein the low-NA optimizer comprises a diverging refractive lens for modifying the concentrated light to a low numerical aperture.

7. The low numerical aperture system for transmitting light for interior lighting of claim 1 wherein the low-NA optimizer comprises a semi-circular light guide shaped to optimize the numerical aperture of the concentrated light.

8. The low numerical aperture system for transmitting light for interior lighting of claim 1 wherein the low-NA optimizer comprises a conic parabolic concentrator for optimizing concentrated light to a low numerical aperture.

9. The low numerical aperture system for transmitting light for interior lighting of claim 1 wherein the low-NA optimizer comprises a conic exponential concentrator for optimizing concentrated light to a low numerical aperture.

10. The low numerical aperture system for transmitting light for interior lighting of claim 1 wherein the low-NA optimizer comprises a reverse compound parabolic concentrator for optimizing concentrated light to a low numerical aperture.

11. The low numerical aperture system for transmitting light for interior lighting of claim 1 wherein the low-NA optimizer comprises a reverse conic exponential concentrator for optimizing concentrated light to a low numerical aperture.

12. The low numerical aperture system for transmitting light for interior lighting of claim 1 wherein the low-NA optimizer comprises a parabolic reflector for optimizing concentrated light to a low numerical aperture.

13. The low numerical aperture system for transmitting light for interior lighting of claim 1 wherein the low-NA optimizer comprises an elliptical reflector for optimizing concentrated light to a low numerical aperture.

14. The low numerical aperture system for transmitting light for interior lighting of claim 1 wherein the at least one light concentrator comprises a Fresnel lens for concentrating light.

15. The low numerical aperture system for transmitting light for interior lighting of claim 14 further comprising a diverging refractive lens for modifying the concentrated light of the light from the at least one light concentrator.

16. The low numerical aperture system for transmitting light for interior lighting of claim 1 wherein the light source is the sun.

17. The low numerical aperture system for transmitting light for interior lighting of claim 1 wherein the light source is artificial lighting.

18. A method for interior lighting, comprising:
   receiving light from a natural source;
   concentrating the light;
   filtering ultraviolet light and infrared light from the light;
   orienting the concentrated light along an optical axis of an low-NA optimizer having at least one light guide mirror by using a highly reflective mirror configured to coordinate to a solar tracking axis and movably affixed to the low-NA optimizer so that the concentrated light has a low numerical aperture within a thermodynamic limit; and
   transmitting the low numerical aperture concentrated light to a light fixture.

* * * * *